United States Patent
Lehmann et al.

(10) Patent No.: US 10,097,180 B2
(45) Date of Patent: Oct. 9, 2018

(54) REINFORCED KEY ASSEMBLY

(71) Applicant: Apple Inc., Cupertino, CA (US)

(72) Inventors: Alex J. Lehmann, Cupertino, CA (US);
Kenneth M. Silz, Cupertino, CA (US);
Paul X. Wang, Cupertino, CA (US);
Qiliang Xu, Cupertino, CA (US);
Zheng Gao, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/260,242

(22) Filed: Sep. 8, 2016

(65) Prior Publication Data

US 2018/0069550 A1 Mar. 8, 2018

(51) Int. Cl.
*H03K 17/975* (2006.01)
*H03K 17/96* (2006.01)
*H01H 13/78* (2006.01)

(52) U.S. Cl.
CPC ........... *H03K 17/975* (2013.01); *H01H 13/78* (2013.01); *H03K 17/962* (2013.01); *H01H 2215/006* (2013.01); *H03K 2217/96062* (2013.01)

(58) Field of Classification Search
CPC .. H01H 13/83; H01H 2219/062; H01H 3/125; H03K 17/962; H03K 2217/960755; H03K 17/975; H03K 2217/96054; H03K 17/9622
USPC ......... 200/5 A, 344, 600, 512–517, 406, 292
See application file for complete search history.

(56) References Cited

U.S. PATENT DOCUMENTS

| | | |
|---|---|---|
| 4,376,238 A | 3/1983 | Martin |
| 5,510,584 A | 4/1996 | Norris |
| 6,303,887 B1 | 10/2001 | Ando |
| 6,355,890 B1 * | 3/2002 | Kuroda ................. H01H 13/70 200/345 |
| 7,064,288 B2 | 6/2006 | Nam |
| 7,411,143 B2 | 8/2008 | Shin et al. |
| 2009/0095611 A1 * | 4/2009 | Villain ................. H01H 25/041 200/5 A |

* cited by examiner

*Primary Examiner* — Ahmed Saeed
(74) *Attorney, Agent, or Firm* — Dorsey & Whitney LLP

(57) ABSTRACT

Embodiments are directed to a dome switch and methods related to the use thereto. In one aspect, an embodiment includes a key cap. The embodiment may further include a domed structure having upper and lower portions. The domed structure may be configured to deform in response to an input force received at the upper portion by the key cap. The embodiment may further include a collar affixed to the lower portion and extending toward the key cap. The collar may resist deformation of the domed surface.

24 Claims, 11 Drawing Sheets

REINFORCED KEY ASSEMBLY

FIELD

The described embodiments relate generally to a key for an input device. More particularly, the present embodiments relate to a key for an input device having a reinforcement member.

BACKGROUND

In computing systems, a key may be employed to receive input from a user. Many traditional keys may suffer from significant drawbacks that may affect the longevity of the key. As such, the need continues for improved methods and approaches to facilitate receiving user input at a key.

SUMMARY

Embodiments of the present invention are directed to a dome switch.

In a first aspect, the present disclosure includes a dome switch. The dome switch includes a key cap. The dome switch further includes a domed structure having upper and lower portions. The domed structure may be configured to deform in response to an input force received at the upper portion by the key cap. The dome switch further includes a collar coupled to the lower portion and extending toward the key cap. The collar may resist the deformation of the domed structure.

A number of feature refinements and additional features are applicable in the first aspect and contemplated in light of the present disclosure. These feature refinements and additional features may be used individually or in any combination. As such, each of the following features that will be discussed may be, but are not required to be, used with any other feature combination of the first aspect.

For example, in an embodiment, the domed structure may include a dome wall extending between the upper and lower portions. The domed structure may be configured to buckle in response to a buckling force. In this regard, a portion of the collar may abut the collar when the domed structure buckles. This may allow the collar to resist deformation of the domed structure in response to the input force exceeding a buckling force.

In another embodiment, the dome switch may further include a sensing element positioned on the collar and configured to produce an electrical response in response to deformation of the domed structure. The sensing element may include an array of capacitive-sensing elements disposed on a top surface of the reinforcement member. In this regard, a position of the key cap relative to each element of the array of capacitive-sensing elements may define an orientation of the key cap. Further, the array of capacitive-sensing elements may be configured to generate an output based on the orientation.

According to another embodiment, the collar may relieve stress within the domed structure when the input force exceeds the buckling force. The abutment of the dome wall and the collar may be operative to control the input force required to deform the upper portion. In some instances, the collar may have a thickness greater than a thickness of the dome wall. Further, a thickness of the lower portion may be greater than thickness of the upper portion.

In another embodiment, the collar may define a chamfer opposite the domed structure. The chamfer may extend around a perimeter of the domed structure. The chamfer may include a sensing element that is configured to detect a deformation of the chamfer.

In another embodiment, the domed structure may include a first material and the collar may include a second material. The first material may be different than the second material. By way of example, the second material may be stiffer than the first material. For example, the collar may be a component that is overmolded to the lower portion.

In this regard, a second aspect of the present disclosure includes a dome switch. The dome switch may include a base. The dome switch further includes a deformable structure having exterior and interior surfaces. The deformable structure may be disposed on the base portion. The dome switch further includes a ring abutting a portion of the exterior surface. The dome switch further includes a sensing structure. The sensing structure may be configured to detect: (i) a first deformation of the deformable structure; and (ii) a second deformation of the deformable structure. The interior surface may be configured to contact the base during at least one of the first and second deformations.

A number of feature refinements and additional features are applicable in the second aspect and contemplated in light of the present disclosure. These feature refinements and additional features may be used individually or in any combination. As such, each of the following features that will be discussed may be, but are not required to be, used with any other feature combination of the second aspect.

For example, in an embodiment, the sensing structure includes a first sensing element disposed on the base. The first sensing element may be configured to detect contact of the interior surface with the base. The sensing structure may further include a second sensing element disposed on the ring. The second sensing element may be configured to detect at least one of: (a) motion of the deformable structure; and (b) contact between the ring and an element encircling the deformable structure. The first sensing element may be configured to generate a first output in response to detecting the contact of the interior surface with the base. Further, the second sensing element may be configured to generate a second output in response to at least one of: (a) detecting the motion of the deformable structure; and (b) detecting the contact between the ring and the element encircling the deformable structure.

According to another embodiment, the ring may be configured to impede deformation of the deformable structure. Additionally, the ring may be configured such that a force-displacement curve characteristic of the deformable structure has at least two peaks. The deformable structure and the ring may define a gap therebetween. The gap may be configured to shrink as the deformable structure deforms.

In this regard, a third aspect of the present disclosure includes a method of operating a dome switch. The method includes detecting a contact between an inner portion of a domed structure and a base portion disposed below the domed structure. The method further includes generating a first user input signal in response to the contact. The method further includes detecting a displacement of an outer portion of the domed structure. The domed structure may include a reinforcement member configured to impede the displacement. The method further includes generating a second user input signal in response to the detected displacement.

A number of feature refinements and additional features are applicable in the third aspect and contemplated in light of the present disclosure. These feature refinements and additional features may be used individually or in any combination. As such, each of the following features that will be discussed may be, but are not required to be, used with any other feature combination of the third aspect.

For example, in an embodiment, the detecting of the displacement further includes detecting the displacement of the outer portion while the contact between the inner portion and the base portion is maintained. In some instances, the domed structure buckles so that the contact between the inner portion and the base portion occurs. Accordingly, the reinforcement member may impede the displacement when the domed structure is buckled.

The method may further include identifying an orientation of the displacement of the outer portion relative to the reinforcement member.

According to another embodiment, the method may further include, in response to the detected displacement, generating a first haptic effect. Additionally, the method may further include, in response to the contact, generating a second haptic effect.

In addition to the exemplary aspects and embodiment described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
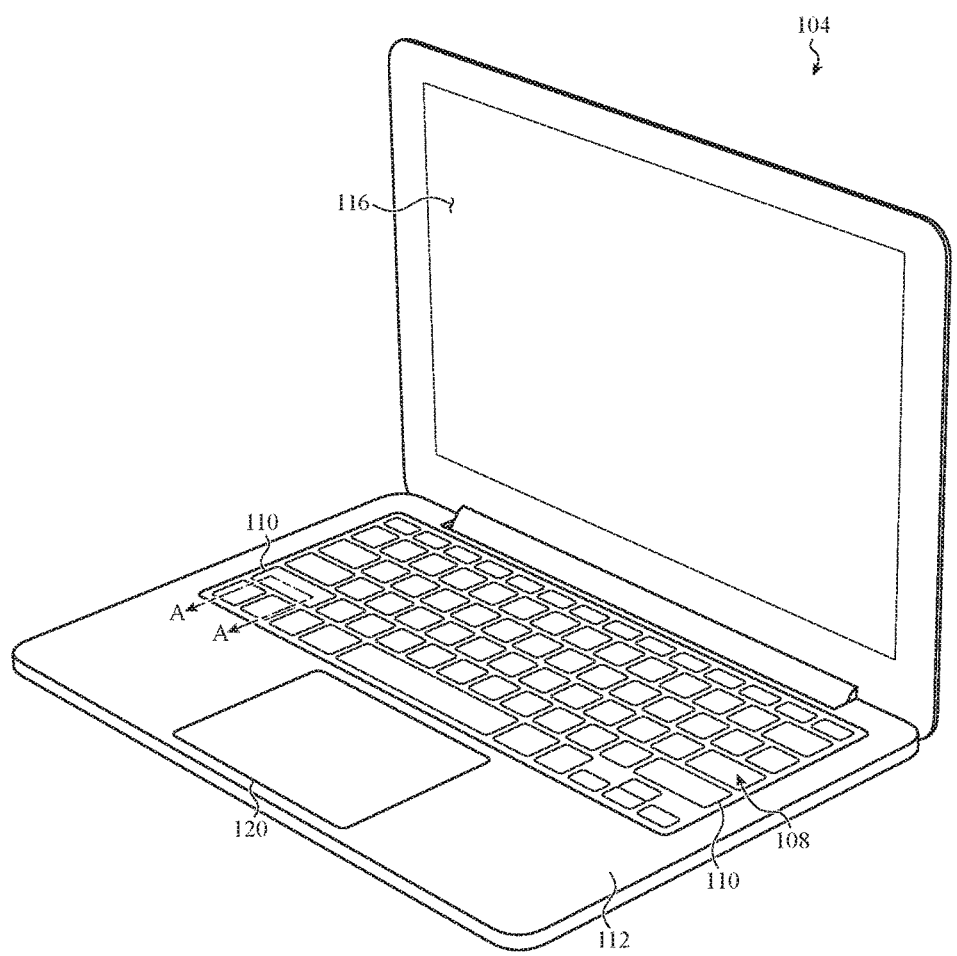
FIG. 1A depicts a sample electronic device including a keyboard.

The description that follows includes sample systems, methods, and apparatuses that embody various elements of the present disclosure. However, it should be understood that the described disclosure may be practiced in a variety of forms in addition to those described herein.

The present disclosure describes systems, devices, and techniques related to a keyboard assembly and, more particularly, to a dome switch used within a keyboard assembly. The dome switch may include a domed structure, deformable structure, and/or any other appropriate structure having a deformable convex top surface. A collar, reinforcement member, or other structural member may extend around a perimeter of the domed structure. The collar or reinforcement member may abut and/or couple with the domed structure, such that it reinforces the domed structure.

The collar or reinforcement member may impede deformation of the domed or deformable structure. For example, a key cap of an associated key may impact and deform the domed structure as the key moves towards the domed structure in response to a received force. The collar may abut the domed structure such that it prevents the domed structure deforming beyond a predetermined amount or point. This may decrease stress and strain on the domed structure over time. Thus, the collar may reduce degradation of the domed structure, thereby enhancing the longevity of a dome switch subjected to repeated, prolonged, and/or excessive applications of force.

The dome switch may also include a sensing element coupled to a portion of the collar. The sensing element be a component of a sensing structure that is configured to detect a range of deformations of the domed or deformable structure. The sensing structure may also include an electrical contact disposed below the domed structure to detect multiple switch events initiated by collapse of the dome. This may allow the dome switch to control one or more functions of a computing device.

For example, the dome switch may control a first function of a computing device in response to the sensing structure detecting contact between the electrical contact and an inner portion of the domed structure. The dome switch may control a second function of a computing device in response to the sensing structure detecting a certain amount of deflection or deformation of the domed structure. This deflection or deformation may be less than that required for the domed structure to impact the electrical contact. The sensing structure may detect the foregoing parameters of the domed structure using one sensing element (e.g., a capacitive sensor) or multiple sensing elements (e.g., a capacitive sensor, an electrical contact sensor, or the like), as may be appropriate for a given application.

Reference will now be made to the accompanying drawings, which assist in illustrating various features of the present disclosure. The following description is presented for purposes of illustration and description. Furthermore, the description is not intended to limit the inventive aspects to the forms disclosed herein. Consequently, variations and modifications commensurate with the following teachings, and skill and knowledge of the relevant art, are within the scope of the present inventive aspects.

FIG. 1 depicts an example electronic device 104 having a keyboard assembly 108. Each key of the keyboard assembly 108 may include a "stack up" of layered components that cooperate to trigger a switch event in response to a force input. The keyboard assembly 108 may include one or more dome switches, such as the dome switch discussed above and described in greater detail below. In this regard, each key of the keyboard assembly 108 may include a collar (e.g., a reinforcement member) that extends around a perimeter of a key's domed or deformable structure, thereby reinforcing the domed or deformable structure when the structure collapses. For example, as described in greater detail below, the collar may abut and/or couple with the domed structure to resist a translation and/or a deformation of the domed structure when the dome switch is depressed.

In a non-limiting example, as shown in FIG. 1, the electronic device 104 may be a laptop computer. However, it is understood that electronic device 104 may be any suitable device that operates with the keyboard assembly 108 (or any other suitable device). Other examples of electronic devices may include wearable devices (including watches, glasses, rings, or the like), health monitoring devices (including pedometers, heart rate monitors, or the like), and other electronic devices, including digital cameras, printers, scanners, security systems or devices, or electronics for automobiles, among other electronic devices. For purposes of illustration, FIG. 1A depicts the electronic device 104 as including the keyboard assembly 108, an enclosure 112, a display 116, and one or more input/output members 120. It should be noted that the electronic device 104 may also include various other components, such as one or more ports (e.g., a charging port, a data transfer port, or the like), communications elements, additional input/output members (including buttons), and so on. As such, the discussion of any computing device, such as computing device 104, is meant as illustrative only.

The keyboard assembly 108 may be positioned within the enclosure 112. In a non-limiting example shown in FIG. 1, the keyboard assembly 108 may include a set of key caps 110. The set of key caps 110 may partially protrude from the enclosure 112 and each key cap of the set of key caps 110 may be substantially surrounded by the enclosure 112. The set of key caps 110 may be configured to receive a force input. The force input may depress a particular one of the set of keycaps 110 to trigger one or more switch events that may control the electronic device 104. As depicted, the keyboard assembly 108 may be positioned within the electronic device 104. In an alternative embodiment, the keyboard assembly 108 may be a distinct, standalone component in electronic communication with the electronic device via a wireless or hardwired connection.

Figure 1B:
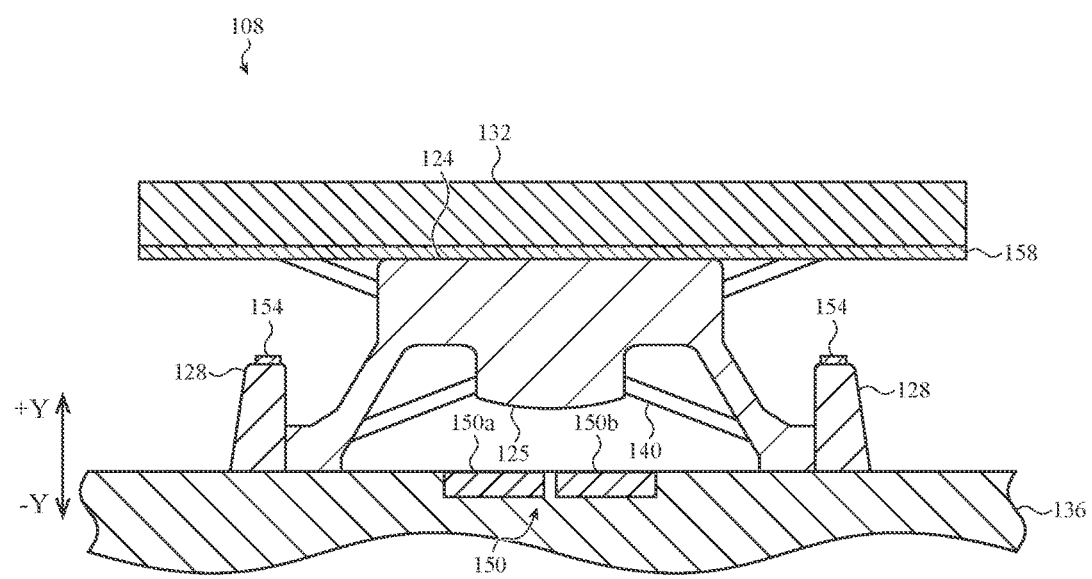
FIG. 1B depicts a cross-sectional view of the embodiment of the user input device of FIG. 1A, taken along line A-A of FIG. 1A.

FIG. 1B is a cross-sectional view of the keyboard assembly 108 of FIG. 1A, taken along line A-A of FIG. 1A. As illustrated, the keyboard assembly 108 includes a domed structure 124 (e.g., a deformable structure), a collar 128 (e.g., a reinforcement member), a key cap 132, a substrate 136 (e.g., a printed circuit board having one or more sensors or electrical contacts or the like), and a support structure 140. The substrate 136 may define a base or base portion of the keyboard assembly 108. The domed structure 124 may be formed from any appropriate material (e.g., including metal, rubber, or the like) that exhibits sufficiently elastic characteristics. For example, the domed structure 124 may be sufficiently elastic or resilient such that it does not permanently deform from applied force (e.g., the domed structure 124 may substantially return to an original or undeformed shape after the force ceases). In this regard, the key cap 132 may deform the domed structure 124 upon the depression of the key cap 132. In turn, the domed structure may return to an undeformed shape when the key cap 132 returns to a neutral or undepressed condition. The domed structure 124 may not be limited to the above example materials, and may also include any other appropriate materials consistent with the various embodiments presented herein, including silicone, plastic or other flexible and resilient materials.

As shown in FIG. 1B, the support structure 140 may support the key cap 132. The support structure 140 may be constructed from any appropriate material (e.g., including plastic, metal, composites, ceramics, or the like). The support structure 140 may be a scissor mechanism or a butterfly mechanism that may contract and expand during depression and release of the key cap 132, respectively. In other embodiments, the support structure 140 may be defined by various other components contemplated within the scope of the present disclosure.

The key cap 132 may contact the domed structure 124 to trigger a switch event (described in more detail below with respect to FIGS. 6A-6D). For example, one or more sensing elements (e.g., a sense layer 154, a drive layer 158) may detect a deformation and/or translation of the domed structure 124 (or a portion thereof) and trigger a corresponding switch event. Additionally or alternatively, one or more sensing elements (e.g., a contact sensor 150) may detect a contact between an underside of the domed structure 124 and the substrate 136 disposed below the domed structure 124 to trigger another switch event. For example, the one or more sensing elements may detect a contact between the domed structure 124 and a base or base portion of the keyboard assembly 108. The sense layer 154, drive layer 158, and/or contact sensor 150 may collectively define a sensing structure configured to detect a range of deformations of the domed structure 124 and/or trigger multiple switch events.

The domed structure 124 may be disposed on the substrate 136. The domed structure 124 and the substrate 136 (together with any other appropriate components) may define a dome switch that triggers a switch event, or multiple switch events, upon the buckling and/or deformation of the dome switch (or a portion thereof). The substrate 136 may define a base or base portion of the keyboard assembly 108. The substrate 136 may include any appropriate, electrically conductive material, including, but not limited to, a metal layer, an indium tin oxide or other alloy layer, a conductive composite layer, and so on. The substrate 136 may include at least one trace or sensor positioned on a top or bottom surface, or within, the substrate 136 (e.g., such as the contact sensor 150). The contact sensor 150 may detect contact between the substrate 136 and the domed structure 124 (e.g., such as a contact between a protrusion 125 and the contact sensor 150). In response to the detected contact, the contact sensor 150 may generate an electrical response. The electrical response may be a user input signal corresponding to a predetermined function that is executable by a computing device.

The collar 128 may extend around a perimeter of the domed structure 124. The collar 128 may be constructed of any appropriate materials (e.g., including metal, rubber, plastic, composite, or the like) that exhibits sufficient rigidity. For example, the collar 128 may have a sufficient rigidity in order to impede or resist deformation of the domed structure 124 (or a portion thereof). In some cases, various other physical attributes of the collar 128 (e.g., including width, height, surface features, and so on) may be modified to increase or otherwise adjust the rigidity of the collar 128. The collar 128 need not be limited to the above example materials, and may also include other appropriate materials consistent with the various embodiments discussed herein.

The collar 128 may be constructed of a material different than that of the domed structure 124. As a non-limiting example, the collar 128 may be a hardened plastic overmolded on the domed structure 124. The collar 128 may be stiffer than the domed structure 124. The greater stiffness of the collar 128 may allow the collar 128 to resist deformation of the domed structure 124. Alternatively, the collar 128 may be the same material as the domed structure 124. In some cases, the collar 128 and the domed structure 124 may be a unitary component.

The collar 128 may abut and/or couple with the domed structure 124 to reinforce the domed structure 124. For example, the collar 128 may reinforce the domed structure 124 when the key cap 132 is depressed. To illustrate, depression of the key cap 132 may cause at least a portion of the domed structure 124 to translate and deform until the domed structure 124 buckles (e.g., collapses). The domed structure 124 is therefore configured to deform in response to the depression of the key cap 132. Continued depression of the key cap 132 subsequent to the domed structure 124 buckling may create an overloaded condition. In an overloaded condition, the domed structure 124 may further deform (e.g., including bowing, or extending out in a direction transverse to the depression of the key cap 132), thereby causing increased stress and strain within the domed structure 124.

The collar 128 may resist deformation of the domed structure 124 resulting from an overloaded condition. The collar 128 may physically obstruct deformation of the domed structure 124 beyond a predetermined point. This may be due to the abutment of the collar 128 with the domed structure 124 as the domed structure 124 collapses. Accordingly, and as described above, the collar 128 may have physical attributes (e.g., including a sufficient rigidity, thickness, height, and so on) to resist deformation of the domed structure 124 in an overloaded condition. For example, the collar 128 may be sufficiently rigid to counteract a force caused by the continued depression of the key cap 132, thereby impeding the continued deformation of the domed structure 124. This may reduce strain within the domed structure 124 when the key cap 132 is depressed.

Figure 2A:
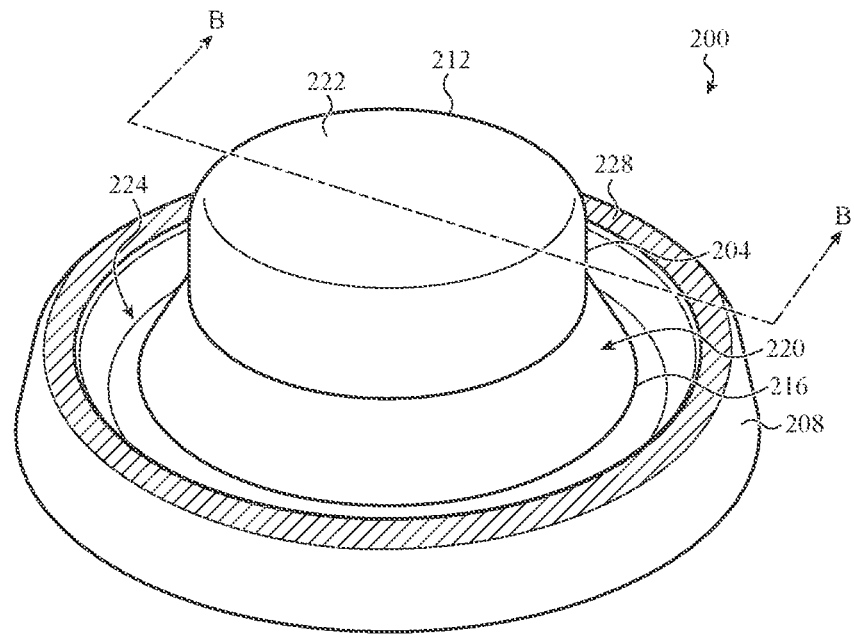
FIG. 2A depicts a top view of a sample domed structure.

In this regard, FIG. 2A depicts a dome switch 200 having a domed structure 204 and a collar 208. As described above, the collar 208 may be a reinforcement member. The domed structure 204 and the collar 208 may be substantially analogous to the domed structure 124 and the collar 128 described with respect to FIG. 1B. The domed structure 204 may be a deformable structure. For example, the collar 208 may abut or otherwise encircle the domed structure 204 to reinforce the domed structure 204.

The domed structure 204 may have an upper portion 212 and a lower portion 216. The domed structure 204 may include a dome wall 220 extending between the lower portion 216 and the upper portion 212. As depicted in FIG. 2A, the domed structure 204 may be substantially planar at the upper portion 212. The lower portion 216 may be wider than the upper portion 212.

The domed structure 204 may have a top surface 222 as part of the upper portion 212. The top surface 222 may be substantially planar and configured to receive a contact force from a key cap (e.g., such as the key cap 132 described with respect to FIG. 1B). In other embodiments, the top surface 222 may include various other features (e.g., including indentations, protrusions, or the like) to receive or engage a key cap.

In one embodiment, the collar 208 may be coupled to the domed structure 204 at the lower portion 216. For example, the collar 208 may be affixed to the domed structure 204 at the lower portion 216 by any appropriate mechanism, including via an adhesive, mechanical fasteners, an overmold, or the like. In the case of an overmold, the collar 208 may be formed from an injection moldable plastic or other polymer that is molded over the domed structure 204. Molding the collar 208 over the domed structure 204 may directly bond the collar 208 to the lower portion 216 such that the collar 208 is affixed to the domed structure 204.

The collar 208 may be separated from the domed structure 204 such that a gap, channel, void, or the like exists between the collar 208 and the domed structure 204. A size and a shape of the gap 224 may change based on a state (e.g., such as a state of deformation) of the domed structure 204. For example, the size and the shape of the gap 224 may change as the domed structure deforms in response to a contact force received at the top surface 222.

The domed structure 204 may be configured to deform in response to a force received at the top surface 222 (e.g., such as a force received from a key cap being depressed on to the domed structure 204). As one example, the upper portion 212 may translate (e.g., relative to the lower portion 216) and subsequently collapse in response to the received force. In turn, the dome wall 220 may collapse or otherwise deform as the domed structure 204 buckles. As the dome wall 220 buckles, the size and the shape of the gap 224 may change based at least partially on the physical attributes of the collar 208 and the position of the collar 208 in relation to the domed structure 204.

The collar 208 may resist an elongation or bowing of the domed structure 204 in a direction towards the collar 208, once the domed structure impacts (or otherwise contacts or abuts) the collar. As the upper portion 212 translates, the lower portion 216 may deform toward the collar 208. The lower portion 216 may bow or otherwise extend in a direction away from the domed structure 204. The abutment of the collar 208 with the lower portion 216 may prevent or impede the lower portion 216 from deforming. The collar 208 may therefore define a physical barrier that prevents the lower portion 216 from deforming beyond a predetermined point. This may reduce strain within the domed structure 204 because the collar 208 reduces the deformation of the domed structure 120404 during continued or prolonged applications of force.

The domed structure 204 may also include sensing element 228. The sensing element 228 may be a sensing structure. In a non-limiting embodiment, the sensing element 228 may be a component of a capacitive sensor having capacitive-sensing elements. The sensing element may be a discrete electrode (e.g., including a plate, conductor, or other appropriate element) that defines a touch-sensing region. A capacitance may be defined between the sensing element 228 and another electrode disposed on or within the domed structure. The another electrode may be disposed on the dome switch 200 and/or (with reference to FIG. 1A) electronic device 104 or the set of key caps 110. Accordingly, as discussed in greater detail below with respect to FIGS. 6A-6D, a change in capacitance may be detected upon the translation of the domed structure 204 (or a portion thereof). In some cases, the electronic device 104 may execute one or more functions based on the detected change in capacitance.

In one embodiment, the sensing element 228 may produce an electrical signal varying with a magnitude of a detected change in capacitance. For example, the sensing element 228 may generate a first electrical signal in response to a first translation or first deformation of the domed structure 204 (corresponding to a first magnitude of a change in capacitance). Similarly, the sensing element 228 may generate a second electrical signal in response to a second translation or second deformation of the domed structure 204 (corresponding to a second magnitude of a change in capacitance). In some instances, the first and second electrical signals may be used to control separate functions executable on a computing device. This may allow a keyboard key to cause multiple functions to be executed by a computing device based on the degree to which a user depresses the key. Additionally or alternatively, and as discussed in greater detail below with respect to FIGS. 6A-6D, the sensing element 228 may be used in conjunction with an electrical contact disposed below the domed structure 204 in order to trigger a switch event based on the translation of the domed structure 204 and/or a contact between the domed structure 204 and the electrical contact.

In another embodiment, the sensing element 228 may be a strain-sensing element (e.g., a piezoelectric sensor, strain gauge, or the like) disposed on and/or within the collar 208. The sensing element 228 may detect a deformation of the domed structure 204. For example, the sensing element 228 may exhibit a change in an electrical property in response to a mechanical stress within the domed structure 204 and/or the collar 208 (e.g., such as a mechanical stress induced by the depression of a key cap in a direction toward the domed structure 204). Analogous to the embodiments described above, the sensing element 228 may be used to control one or more functions of a computing device based on a change in electrical property exhibited by the strain-sensing element. In some instances, the sensing element 228 may include one or more of, or both of, a capacitive sensor (e.g., having capacitive-sensing elements) and a strain-sensing element and/or any other appropriate sensing element according to the embodiments described herein.

Figure 2B:
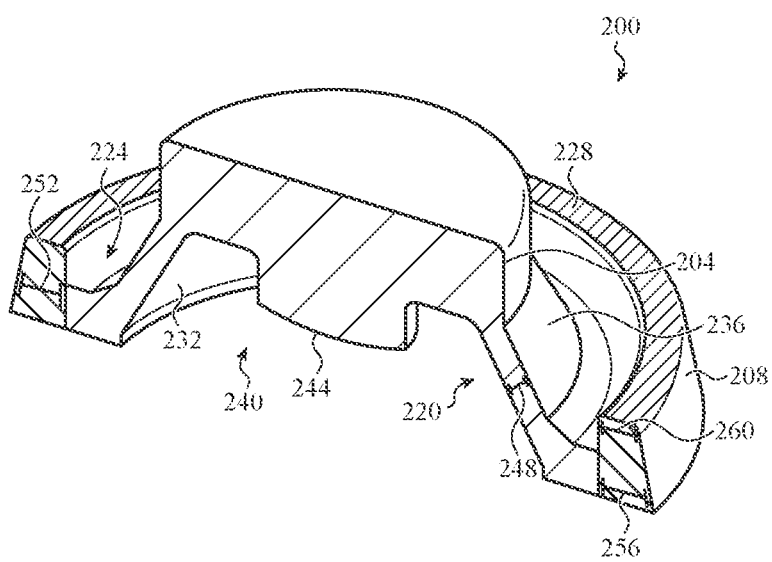
FIG. 2B depicts a cross-sectional view of the domed structure of FIG. 2A, taken along line B-B of FIG. 2A.

FIG. 2B is a cross-sectional view of the dome switch 200 of FIG. 2A, taken along line B-B of FIG. 2A. As depicted, the domed structure 204 may have an interior surface 232 and an exterior surface 236. The interior surface 232 may define a cavity 240 between the domed structure 204 and a substrate, base, or base portion of the keyboard assembly (e.g., such as substrate 136 depicted in FIG. 1B). A portion of the interior surface 232 may define a protrusion 244 extending into the cavity 240.

In one embodiment, the cavity 240 may collapse upon translation of the upper portion 212. For example, the dome wall 220 may buckle in response to the upper portion 212 translating a predefined distance (e.g., such as a distance corresponding to a predefined buckling force). In some instances, upon the collapsing of the cavity 240, the protrusion 244 may contact a substrate or other surface disposed below the domed structure 204 to trigger a switch event.

As shown in FIG. 2B, the dome walls 220 may have a wall width 248 and the collar 208 may have a collar width 252 (e.g., such as a width of the collar 208 at a mid-point of the collar 208). The collar 208 may be constructed with the collar width 252 to facilitate the collar 208 impeding the deformation of the domed structure 204. As shown, the collar width 252 may be greater than the wall width 248. The collar width 252 being greater than the wall width 248 may allow the collar 208 to physically obstruct the deformation of the domed structure 204 as the domed structure 204 presses into the collar 208. This may occur when the domed structure 204 deforms in response to exerted force. In other instances, the collar width 252 may be equal to, or less than, the wall width 248, as may be appropriate for a given application. This may be the case for example, when the collar 208 is constructed from a material different than that of the domed structure 204 (e.g., such as an injection moldable plastic collar molded over a rubber dome).

The collar 208 may have a bottom portion with a bottom collar width 256 and a top portion with a top collar width 260. As depicted in FIG. 2B, the bottom collar width 256 may be greater than the top collar width. This may mechanically stabilize the collar 208 by lowering a center of gravity of the collar 208 towards the bottom portion of the collar 208. Due to the lower center of gravity, the collar 208 may be less susceptible to bending, twisting, or the like when the domed structure 204 exerts a force on the collar 208 (e.g., such as that caused by a deformation of the domed structure 204). This may allow the collar 208 to resist a greater amount of deformation of the domed structure 204 once the domed structure impacts the collar, as compared with a collar having a higher center of gravity.

Figure 2C:
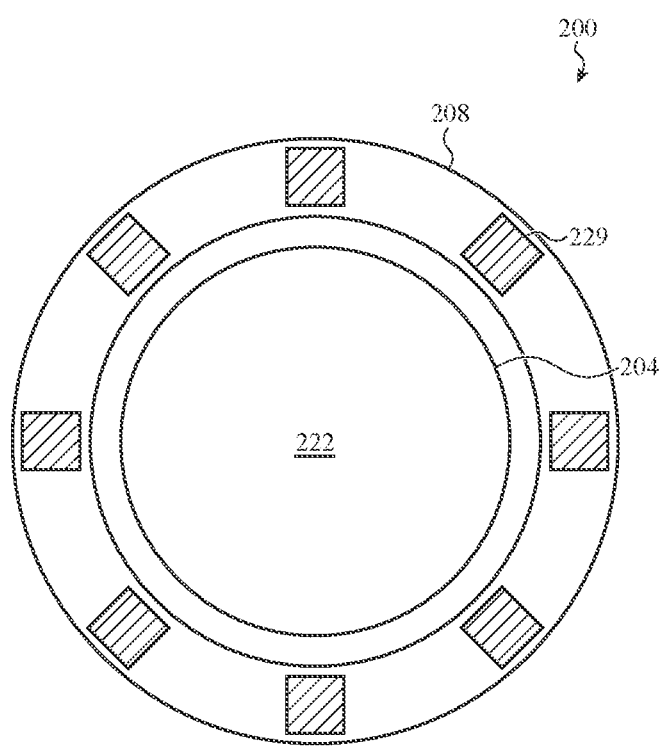
FIG. 2C depicts a top view of another sample domed structure.

FIG. 2C presents a top view of the dome switch 200 according to an alternative embodiment. Here, FIG. 2C depicts an array of sensing elements 229 on a top surface 222 of the collar 208. Analogous to the sensing element 228 described with respect to FIG. 2A, each sensing element of the array of sensing elements 229 may be a discrete electrode of a force-sensing region. In this regard, a capacitance may be defined between any of the array of sensing elements 229 and another electrode of the dome switch 200 or, with reference to FIGS. 1A and 1B, electronic device 104 or the key cap 132. A change in capacitance may be detected between any of the array of sensing elements 229 and the another electrode to identify deformation of the domed structure 204.

The array of sensing elements 229 may detect an orientation of the key cap 132, which may be disposed above the domed structure 204. The key cap 132 may include one or more electrodes disposed on, or within, the key cap 132. A change in capacitance may be detected between the array of sensing elements 229 and the electrodes of the key cap 132 when the key cap 132 is pressed towards the domed structure 204. When the key cap 132 is pressed towards the domed structure 204 at an angle, a first portion of the key cap 132 may be closer to the array of sensing elements 229 than a second portion of the key cap 132. Accordingly, a capacitance measured between the array of sensing elements 229 and the first portion of the key cap 132 may be different than a capacitance measured between the array of sensing elements 229 and the second portion of the key cap 132. Each measured capacitance may be correlated with a distance between the array of sensing elements 229 and the respective portion of the key cap 132 to determine an orientation or angle at which the key cap 132 presses onto the domed structure 204.

In some embodiments, each of the sensing elements 229 may be strain-sensing elements. The strain-sensing elements may be configured to measure a deformation of the domed structure 204, as described above in relation to FIG. 2B. Additionally or alternatively, the array of sensing elements 229 may include a combination of capacitive electrodes (or capacitive-sensing elements) and strain-sensing elements that may operate together to detect a translation and/or deformation of the domed structure 204.

Figure 3:
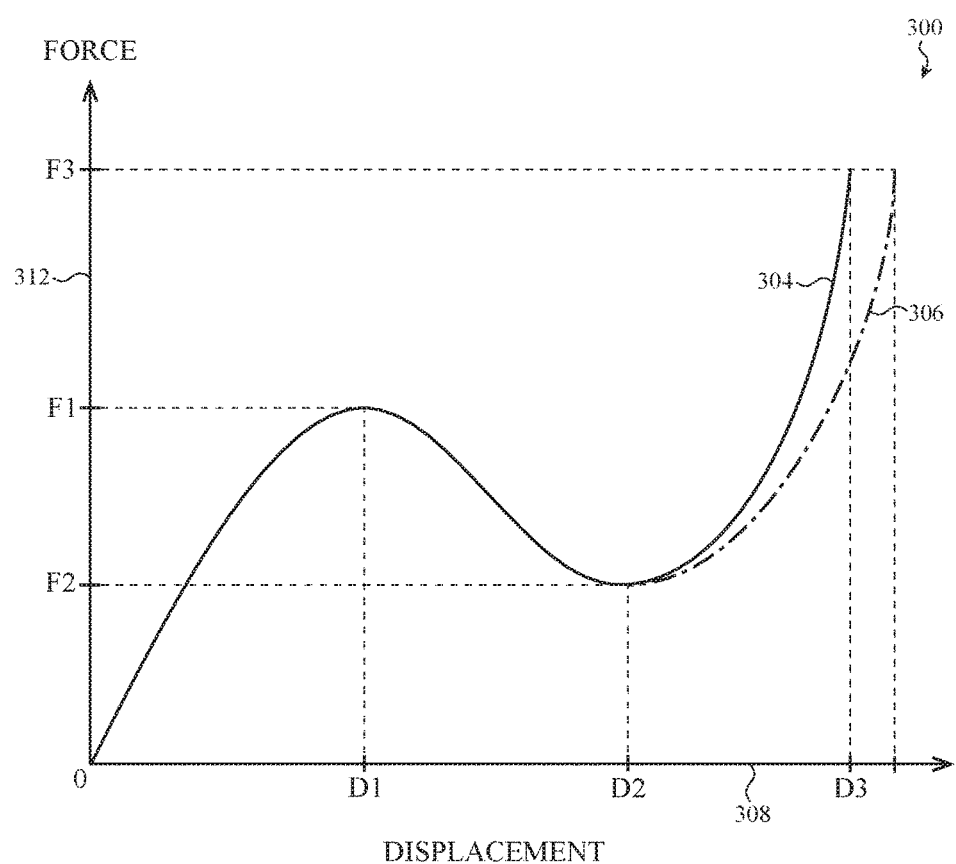
FIG. 3 depicts a sample force-displacement curve for the sample domed structures of FIGS. 2A-2C.

FIG. 3 depicts a force-displacement diagram 300. The force-displacement diagram 300 depicts a sample force required to displace a portion of a domed structure, such as any of the domed structures described with respect to FIGS. 1A-2C. In particular and with reference to FIGS. 2A-2C, diagram 300 depicts a curve 304 that represents the force required to displace the upper portion 212 of the domed structure 204.

The diagram 300 includes a displacement axis 308 and a force axis 312. The displacement axis 308 represents a perpendicular displacement of the upper portion 212 of the domed structure 204 (e.g., such as the displacement caused by the depression of a key cap disposed above the domed structure 204). Increasing values along the displacement axis 308 indicate translation of the upper portion 212 from a neutral position. The force axis 312 may represent a force required to displace the upper portion 212 to a respective position represented on the displacement axis 308.

As shown in FIG. 3, the force required to displace the upper portion 212 may gradually increase until the upper portion 212 reaches a first deflection point D1. This gradual increase in force may at least partially be due to the resistance of the domed structure 204 to change shape. The force required to displace the upper portion 212 to D1 may be referred to as the "operative" or "peak force," represented on curve 304 by F1. As the upper portion 212 is displaced to a second deflection point D2, the domed structure 204 may no longer be able to resist the applied force, and may buckle (e.g., the dome wall(s) 220 may begin to buckle). The force required to displace the upper portion 212 between the first deflection point D1 and the second deflection point D2 may gradually decrease and is represented at curve 304 by F2.

When the upper portion 212 reaches the second deflection point D2, an electrical "make" event occurs in which the protrusion 244 or other portion of the interior surface 232 contacts a substrate disposed below the domed structure 204 to trigger a switch event. In this regard, displacement of the upper portion 212 past D2 may cause the domed structure 204 to deform, for example, due to a counterforce provided by the substrate. As such, the upper portion 212 is displaced to a third deflection point D3, corresponding to a maximum displacement or "bottom-out" position. The force required to displace the upper portion 212 to the third deflection point D3 substantially increases. In this regard, F3 is depicted on the curve 304 as the force required to displace the upper portion 212 to the third deflection point D3.

The physical attributes of one or more of (and/or a combination of) the collar 208 and the domed structure 204 may define the amount of force required to translate the upper portion 212. The collar 208 may be configured to increase the amount of force required to translate the upper portion 212 beyond the second deflection point D2. For example, the collar 208 may impede the deformation of the domed structure 204 when the upper portion 212 translates beyond the second deflection point D2. Accordingly, because the collar 208 impedes deformation of the domed structure 204, a greater amount of force may be required to translate the upper portion 212 beyond the second deflection point D2.

As depicted in FIG. 3, the curve 304 may represent the dome switch 200, which includes the domed structure 204 and the collar 208. In this manner, the force required to displace the upper portion 212 beyond the second deflection point D2 may increase at a substantial rate, for example, due to the reinforcement provided by the collar 208. By way of comparison, diagram 300 also depicts a curve 306 (depicted by a phantom line in FIG. 3), which may represent the force required to displace a top surface of a domed or deformable structure that does not abut or couple with a collar or reinforcement member.

As shown, the domed structure represented by the curve 306 may be displaced further, than the domed structure 204 represented by the curve 304. Accordingly, diagram 300 graphically depicts the effect of adding the collar 208 (e.g., a reinforcement member) to the domed structure 204. That is, the collar 208 may resist the deformation of the domed structure 204 after the domed structure impacts (or otherwise contacts) the collar, thereby requiring a greater amount of force to translate the upper portion 212 between the second deflection point D2 and the third deflection point D3. In one instance, because the collar 208 may reduce the maximum displacement of the upper portion 212 in an overloaded condition, the collar 208 may reduce the degradation of the domed structure 204 (e.g., by reducing the strain experienced within the domed structure 204). This may enhance the longevity of the dome switch, despite being subjected to excessive applications of force.

Figure 4A:
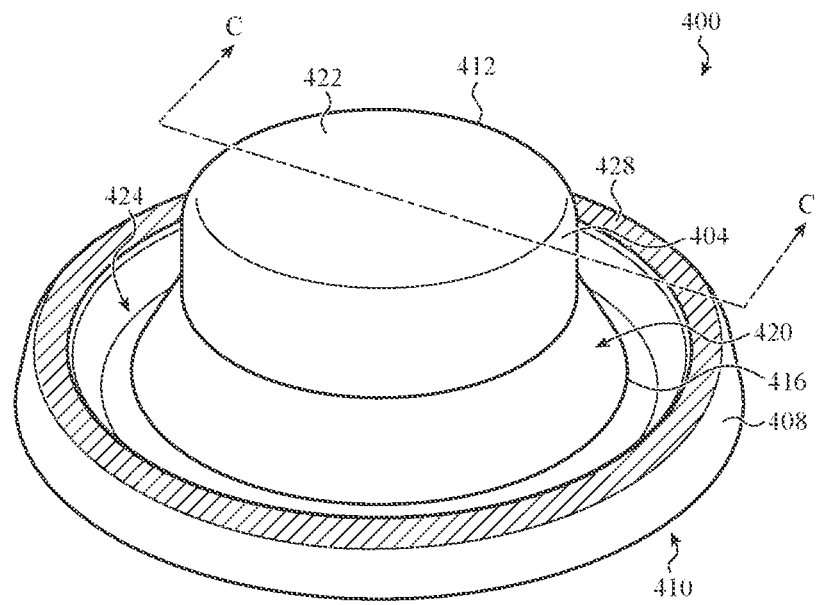
FIG. 4A depicts a top view of yet another a domed structure.
Figure 4B:
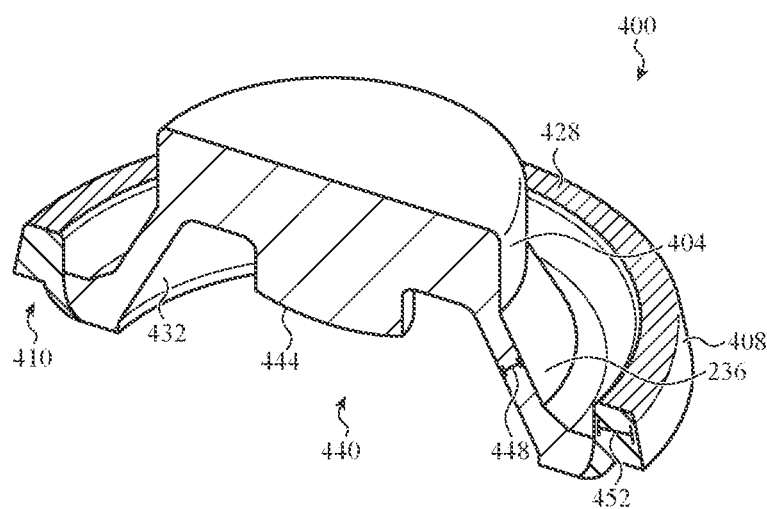
FIG. 4B depicts a cross-sectional view of the domed structure of FIG. 4A, taken along the line C-C of FIG. 4A.
Figure 4C:
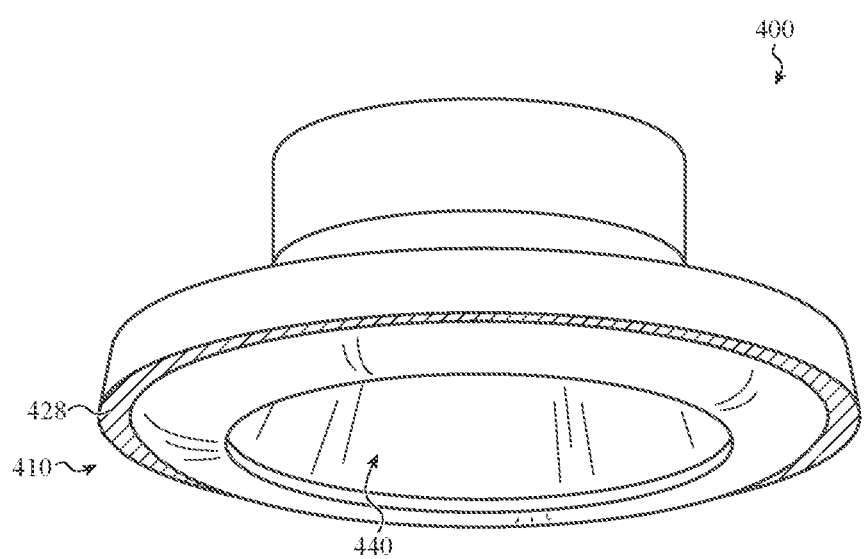
FIG. 4C depicts a bottom view of the sample domed structure of FIG. 4A.

FIGS. 4A-4C illustrate various views and components of a dome switch 400 according to one or more embodiments of the present disclosure. The dome switch 400 shown and described with respect to FIGS. 4A-4C may be substantially analogous to the dome switch 200 described above with respect to FIGS. 2A-2C. For example, the dome switch 400 may include a collar or other reinforcement member that extends around a perimeter of a domed structure. In this regard, analogous to the components described in relation to the embodiments of FIGS. 2A-2C, the dome switch 400 may include: domed structure 404; collar 408; upper portion 412; lower portion 416; dome wall 420; top surface 422; gap 424; sensing element 428 (e.g., a sensing structure); interior surface 432; exterior surface 236; cavity 440; protrusion 444; wall width 448; and collar width 452. The domed structure 404 may be a deformable structure.

FIG. 4A illustrates the dome switch 400 according to one embodiment of the present disclosure. Notwithstanding the foregoing similarities to the dome switch 200, the dome switch 400 may include a collar 408 having (with reference to FIGS. 4A-4C) a chamfer 410. The chamfer 410 may be disposed on an underside of the collar 408 opposite the domed structure 404. The chamfer 410 may modify the amount of force required to translate the upper portion 412, as compared to an embodiment involving an unchamfered collar or reinforcement member. The chamfer 410 may also modify the tactile response of the dome switch 400 by providing tactile feedback subsequent to an electrical "make" event between the protrusion 444 and a substrate disposed below the domed structure 404. In some instances, the sensing element 428 may be disposed on the chamfer 410 in order to detect the translation and/or deformation of the domed structure 404.

FIG. 4B is a cross-sectional view of the dome switch 400 of FIG. 4A, taken along line C-C of FIG. 4A. As shown in in FIG. 4B, the chamfer 410 may be defined by a portion of the collar 408 that is cut or otherwise removed from the collar 408. The chamfer 410 may extend between the lower or bottom portion 416 and, for example, a mid-plane of the collar 408. In other cases, the chamfer 410 may be defined by an upper or top portion or side wall of the collar 208. The chamfer 410 may be linear or non-linear to achieve a desired tactile response and/or a desired amount of force required to move the top portion 412. In some embodiments, the chamfer 410 may extend around a perimeter of the domed structure 404.

FIG. 4C shows the bottom of the dome switch 400 of FIG. 4A. As depicted in FIG. 4C, the sensing element 428 may be disposed on a surface of the chamfer 410. When the sensing element 428 is a capacitive sensor, a capacitance may be defined between the sensing element 428 and another electrode of the dome switch 400 (e.g., on a substrate opposite the chamfer 410). The chamfer 410 may translate and/or deform upon the application of force at the top surface 422. In this regard, a change in capacitance may be detected based, in part, on the translation and/or deformation of the chamfer 410. Upon the detection of a predefined magnitude of a change in capacitance, the dome switch 400 may trigger a switch event. Additionally or alternatively, the sensing element 428 may be used as a force sensor by associating various magnitudes of a change in capacitance with a force exerted on the dome switch 400.

Figure 5:
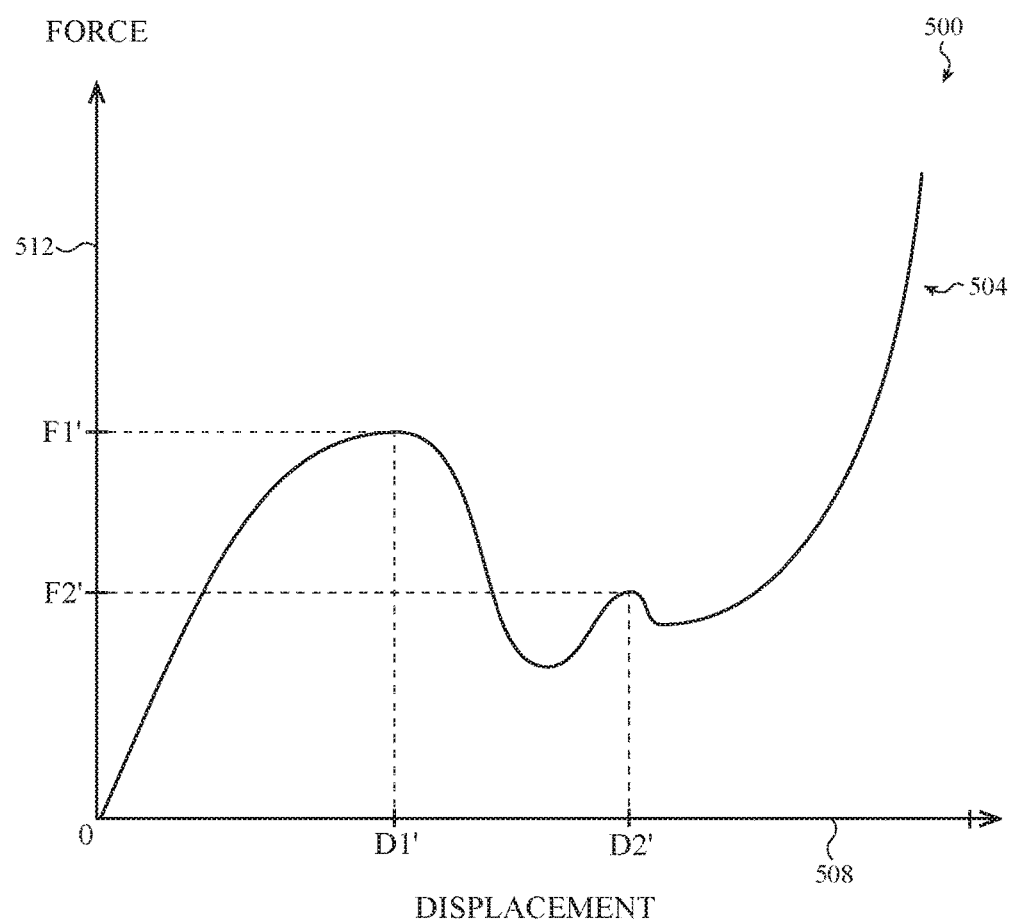
FIG. 5 depicts a force-displacement curve for the domed structure of FIGS. 4A-4C.

FIG. 5 is a force-displacement diagram 500. Analogous to the force-displacement diagram 300, the force-displacement diagram 500 may depict a sample force required to displace a portion of a domed structure, such as the domed structure 404 described in relation to FIGS. 4A-4C. In this regard, the diagram 500 may include: a curve 504; a displacement axis 508; and a force axis 512.

Notwithstanding the similarities to the diagram 300, diagram 500 includes the curve 504, which represents the amount of force required to displace the upper portion 412 of the domed structure 404. As described above, the domed structure 404 may be a component of the dome switch 400. The dome switch 400 includes the collar 408 having the chamfer 410. As shown in the diagram 300, the chamfer 410 may cause the curve 504 to have two peaks. The curve 504 has a first peak, at which the upper portion 412 is displaced to a first deflection point D1' by a force F1'. Further, the curve 504 has a second peak, at which the upper portion 412 is displaced to a second deflection point D2' by a force F2'.

Analogous to the embodiments described in relation to FIG. 3, F1' may correspond to a force that causes the domed structure 404 to buckle. For example, displacing the upper portion 412 to the first deflection point D1' may cause the dome wall 420 to buckle. In this regard, the force required to displace the upper portion 412 beyond the first deflection point D1' initially decreases until an electrical "make" event occurs. The electrical make event may be caused by a contact between the protrusion 444 and a substrate disposed below the domed structure 404.

As shown in in FIG. 5, subsequent to an electrical make event, the amount of force required to displace the upper portion 412 may gradually increase, for example, due to a counterforce provided by the substrate and the collar 408. The amount of force required to displace upper portion 412 may gradually increase until the upper portion 412 reaches the second deflection point D2'. The displacement of the upper portion 412 to the second deflection point D2' may represent the second peak of the curve 504. The force required to displace the upper portion 412 to the second deflection point D2' is represented on curve 504 by F2'. The amount of force required to displace the upper portion 412 beyond the second deflection point D2' may initially decrease. A buckling or rapid deformation of an outer portion of the collar 408 (e.g., a portion of the collar 408 having the chamfer 410) may temporarily reduce the force required to displace the upper portion 412. Subsequent to the buckling or rapid deformation of the collar 408 at the second deflection point D2', the force required to displace the upper portion 412 may gradually increase until a maximum displacement or bottom-out condition is reached.

The size, shape, and configuration of the collar 408 may define the contour of the second peak of the curve 504. In the embodiment of FIG. 5, the chamfer 410 defined on the collar 408 may cause the curve 504 to have the second peak. The chamfer 410 may momentarily collapse, bend, bow, or otherwise change shape at the second deflection point D2', thereby causing the curve 504 to have the second peak. It will be appreciated that the physical properties of the chamfer 410 and/or other features of the collar 408 may be modified to define a contour of the curve 504. This may allow the chamfer 410 and the collar 408 to be constructed so as to produce a desired tactile response. For example, the collar 408 and the chamfer 410 may be constructed such that the curve 504 includes a second peak, a deflection point that is different than the second deflection point D2', and/or is associated with a different displacement force than F2'.

The dome switch 400 may provide various types of tactile feedback based on a configuration of the domed structure 404, the collar 408, and/or any other features of the dome switch 400. In the embodiment of FIG. 5, a user may experience a first tactile response at or near the first peak of the curve 504. The first tactile response may correspond to the initial reduction in force required to displace the upper portion 412 beyond the first deflection point D1'. The first tactile response may indicate to a user the occurrence of a first switch event (e.g., such as when the protrusion 444 contacts a substrate disposed below the domed structure 404).

A user may also experience a second tactile response at or near the second peak of curve 504. The second tactile response may correspond to the initial reduction in force required to displace the upper portion 412 beyond the second deflection point D2'. The second tactile response may indicate to a user a second switch event (e.g., such as may be triggered when the upper portion 412 translates a specified distance).

The first and second tactile responses of the dome switch 400 (and any other tactile responses) may allow the dome switch 400 to control multiple functions of a computing device with a single switch. Each tactile response indicates to a user a particular switch event. Each switch event may correspond to a function executable by a computing device. As such, the various tactile responses of the dome switch 400 may provide an indication to the user of the execution of a particular function of the computing device. In some instances, the tactile response may include various vibrotactile effects, including clicking, popping, or the like to indicate a switch event.

It will be appreciated that the collars or reinforcement members discussed herein (e.g., collar 128, collar 208, collar 408) are described for purposes of illustration. Generally, the collar may be defined by various geometries, configurations, materials, and so on. In this regard, while several example collars and reinforcement members are discussed herein, other collars and reinforcement members are contemplated within the spirt of this disclosure, including collars and reinforcement members defined by different shapes and dispositions relative to a domed or deformable structure. For example, the collar or reinforcement member may resemble the shape of a ring, dome, cube, or any other appropriate shape, and may be symmetrical or asymmetrical in relation to the domed or deformable structure.

FIGS. 6A-6D depict cross-sectional views of the keyboard assembly 108 of FIG. 1A, taken along line A-A of FIG. 1A, according to various configurations, and each is discussed in greater detail below. As described above, the keyboard assembly 108 may be manipulated into a variety of configurations that allow a user to control a computing device, for example, such as electronic device 104 (e.g., as depicted in FIG. 1A). For example, the key cap 132 may be depressed in order to trigger one or more switch events to control a computing device.

Figure 6A:
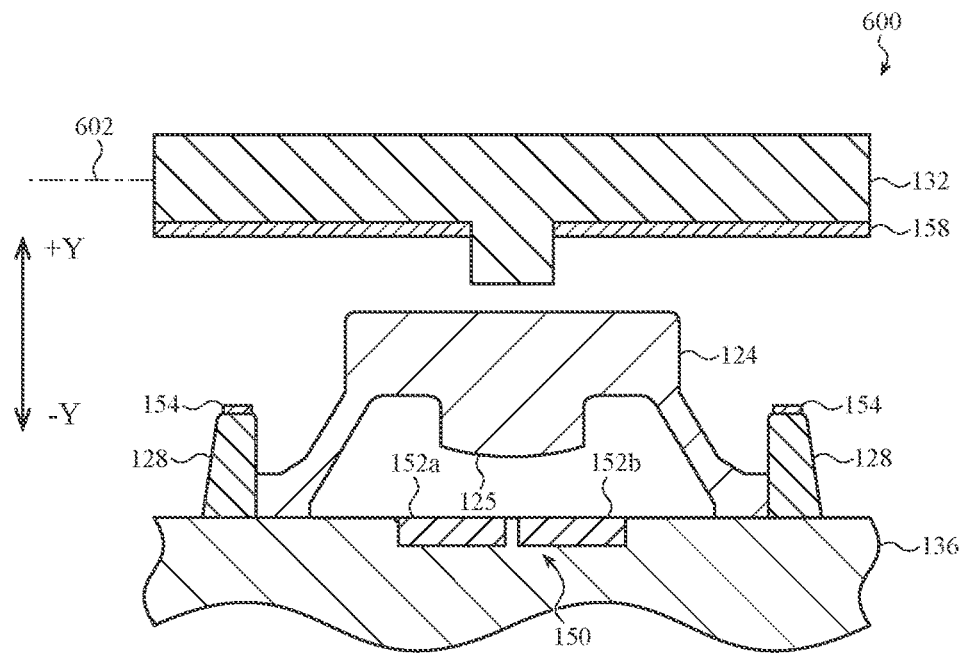
FIG. 6A depicts a cross-sectional view of the keyboard of FIG. 1A in a first configuration, taken along line A-A of FIG. 1A.

FIG. 6A depicts the keyboard assembly 108 in configuration 600. Configuration 600 may correspond to a neutral or undepressed state of the key cap 132. In configuration 600, the key cap 132 is shown at a position 602 along a Y axis.

The keyboard assembly 108 may include a variety of sensing elements configured to detect one or more switch events of the keyboard assembly 108. For example, the keyboard assembly 108 may include a contact sensor 150. The contact sensor 150 may be a component of a sensing structure that is configured to measure multiple parameters of the keyboard assembly 108, including a range of deformations of the domed structure 124. Additionally or alternatively, the contact sensor 150 may be disposed on, or be a component of, the substrate 136. For example, the contact sensor 150 may be disposed on a base or base portion of the keyboard assembly 108. The contact sensor 150 may be any appropriate electrically conductive element (e.g., including an indium tin oxide layer) that is configured to detect a contact between the domed structure 124 and the contact sensor 150.

In one embodiment, the contact sensor 150 may be a sensing structure that includes a first electrode 152a and a second electrode 152b. The first electrode 152a and the second electrode 152b may be electrically isolated. The contact sensor 150 may detect a switch event when another electrode contacts the first and the second electrodes 152a, 152b to form an electrical connection between the first and second electrodes 152a, 152b.

The domed structure 124 may include the protrusion 125 that contacts the contact sensor 150 to trigger a switch event. The protrusion 125 may contact the first and second electrodes 152a, 152b upon the buckling of the domed structure 124 to trigger a switch event. In this manner, a surface of the protrusion 125 may be electrically conductive such that the protrusion 125 forms an electrical connection between the first and second electrodes 152a, 152b upon the buckling of the domed structure 124. In response to the protrusion 125 forming an electrical connection between the first and second electrodes 152a, 152b, the contact sensor 150 may generate an output to control a computing device. As one non-limiting example, the output may correspond to a function for typing a letter on a computing device.

The keyboard assembly 108 may also include sense layer 154 and drive layer 158. The sense layer 154 and the drive layer 158 may collectively define an input or sensing structure that is configured to detect a translation and/or deformation of the domed structure 124 and/or the key cap 132. For example, the sense layer 154 and the drive layer 158 may be a pair of capacitive electrodes. In some instances, the sense layer 154 and/or the drive layer 158 may include various capacitive-sensing elements. In this manner, a capacitance may be defined between the sense layer 154 and the drive layer 158. The capacitance may vary with a distance separating the sense layer 154 and the drive layer 158. Thus, as the key cap 132 is depressed, the sense layer 154 may measure a change in capacitance between the sense layer 154 and the drive layer 158. The change in capacitance may therefore be correlated with, for example, translation of the key cap 132. When the capacitance exceeds a threshold, the keyboard assembly 108 may initiate a switch event. Additionally or alternatively, the capacitance may be associated with a range of non-binary inputs, including associating a change in capacitance with a force received at the key cap 132.

It will be appreciated that the position of the sense layer 154 and the drive layer 158 may be interchanged in certain embodiments. As one example, the sense layer 154 may be disposed on or within the key cap 132 and the drive layer 158 may be disposed on or within the collar 128. The drive layer 158 may be an active or passive component of the input structure. In some cases, the drive layer 158 may be an active or passive shield for the sense layer 154 to enhance sensitivity of the input structure. Additionally or alternatively, the drive layer 158 may be a ground. The drive layer 158 may be a single or unitary component or may be one of an array of active or passive electrodes, analogous to the array of sensing elements 229 described with respect to FIG. 2C.

Figure 6B:
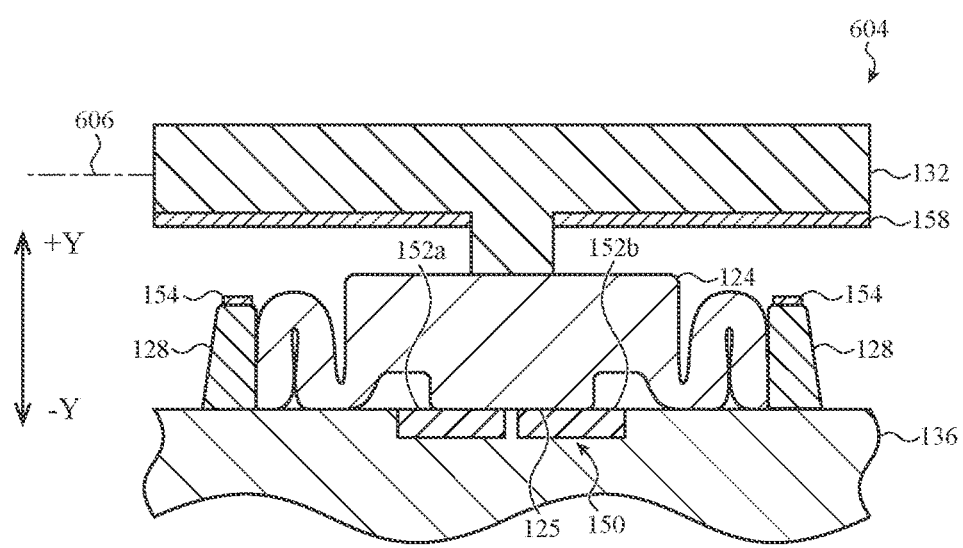
FIG. 6B depicts a cross-sectional view of the keyboard of FIG. 1A in a second configuration, taken along line A-A of FIG. 1A.

FIG. 6B depicts the keyboard assembly 108 in configuration 604. Configuration 604 may correspond to a depressed state of the key cap 132 such as one configured to trigger a first switch event. In configuration 604, the key cap 132 is shown at a position 606.

At position 606, the key cap 132 may be depressed such that the domed structure 124 buckles or collapses. For example, a wall of the domed structure 124 may fold over to accommodate the displacement of the domed structure 124 toward the contact sensor 150.

Figure 6C:
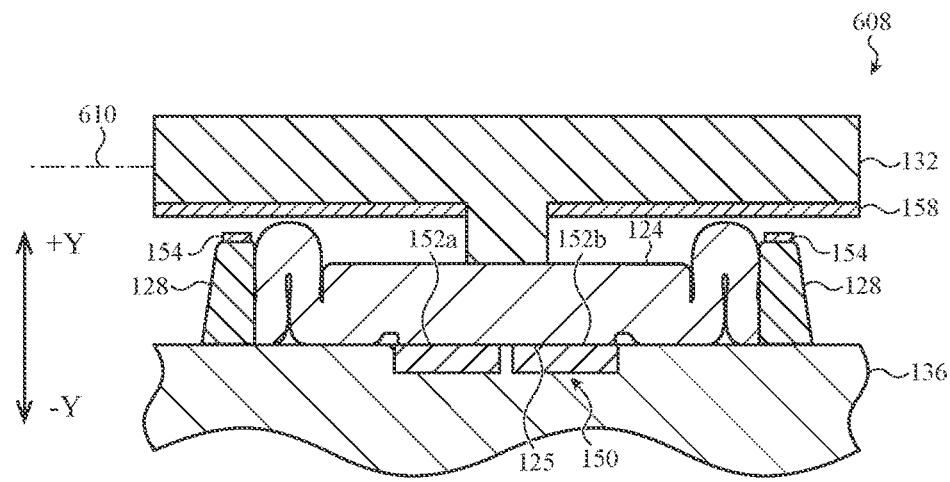
FIG. 6C depicts a cross-sectional view of the keyboard of FIG. 1A in a third configuration, taken along line A-A of FIG. 1A.

FIG. 6C depicts the keyboard assembly 108 in yet another configuration 608. Configuration 608 may occur when the key cap 132 is fully depressed (e.g., at position 610).

At position 610, the key cap 132 may be depressed beyond the position 606 (e.g., in the −Y direction). Notwithstanding that the protrusion 125 contacts the contact sensor 150 at position 606, the key cap 132 may be depressed to position 610 because the domed structure 124 and protrusion 125 are deformable. That is, a force applied to the key cap 132 when in position 606 may cause the domed structure 124 and the protrusion 125 to deform such that the key cap 132 is in position 610.

In one embodiment, displacement of the key cap 132 to position 610 may trigger a second switch event. For example, the input structure defined by the sense layer 154 and the drive layer 158 may trigger a second switch event upon the detection of a predefined magnitude or amount of displacement of the key cap 132. As depicted in FIG. 6C, the second switch event may be detected upon the key cap 132 being displaced to position 610. This may allow the keyboard assembly 108 to control multiple functions of a computing device with a single domed structure 124. As a non-limiting illustration, moving the keycap 132 to position 606 may cause a user input signal to be generated that inputs a lower case letter into a computing device, while continued depression of the key cap 132 to position 610 may correspond to inputting a capital letter.

Further, as depicted in FIG. 6C, the collar 128 may be a reinforcement member that reinforces the domed structure 124 as the key cap 132 moves downward. For example, the collar 128 may resist deformation of the domed structure 124 as the domed structure 124 is depressed by the key cap 132, at least once the key cap 132 has moved far enough to buckle the domed structure 124 to the point that the dome wall impacts the collar 128. To facilitate the foregoing, the collar 128 may physically obstruct continued deformation of the domed structure 124. In one embodiment, the collar 128 may physically obstruct deformation of the domed structure 124 along a direction transverse to the motion associated with the depression of the key cap 132.

Figure 6D:
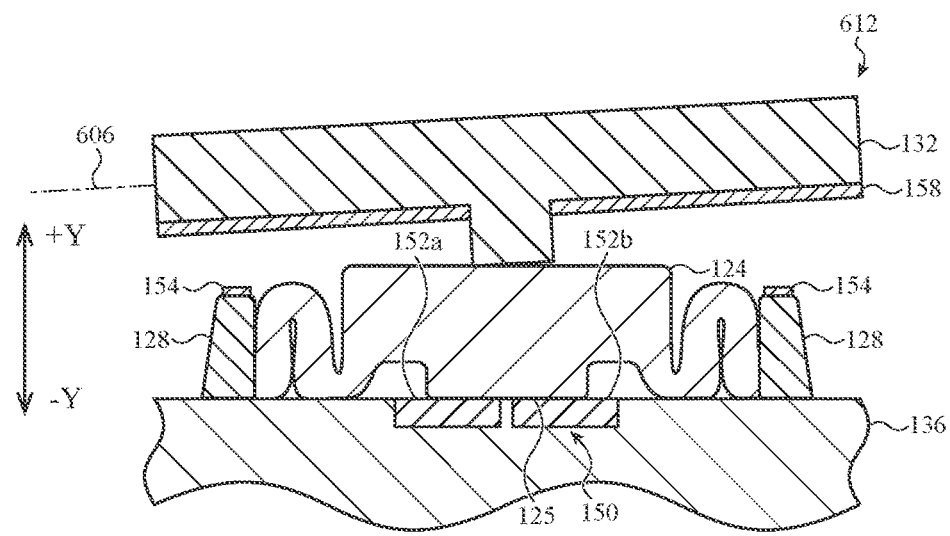
FIG. 6D depicts a cross-sectional view of the keyboard of FIG. 1A in a fourth configuration, taken along line A-A of FIG. 1A.

FIG. 6D depicts the keyboard assembly 108 in configuration 612. Configuration 612 may correspond to a state in which the key cap 132 is asymmetrically depressed about a center of the domed structure 124. In configuration 612, the key cap 132 is shown at a second, tilted and/or partly depressed position along the Y axis.

It some instances, the sense layer 154 and/or the drive layer 158 may be position-sensing. For example, the sense layer 154 may detect a change in capacitance between portions of the sense layer 154 and/or the drive layer 158. For example, as shown in FIG. 6D, the sense layer 154 may detect a first change in capacitance between the sense layer 154 and the drive layer 158. The sense layer 154 may also detect a second change in capacitance between the sense layer 154 and the drive layer 158 at a position B. As depicted in FIG. 6D, the first capacitance may be less than the second capacitance, thereby indicating that a left side of the key cap 132 is lower than a right side of the key cap 132 (at position B). To facilitate the foregoing, the sense layer 154 may be an array of capacitive electrodes, such as the array of sensing elements 229 described in relation to FIG. 2C.

The position-sensing capacitance sensing capability of the sense layer 154 and the drive layer 158 may therefore detect an orientation of the key cap 132. For example, the key cap 132 may be depressed asymmetrically and/or at an angle with respect to a center of the domed structure 124. As such, a portion or certain elements of the drive layer 158 may be closer to the sense layer 154 than another portion or elements of the drive layer 158. For example, the drive layer 158 is depicted as being closer to the sense layer 154 on the left side of the key cap 132 than on its right side (as shown with reference to FIG. 6D). Accordingly, the sense layer 154 may measure the change in capacitance between the sense layer 154 and the drive layer 158 at both the positions A and B to determine an orientation of the key cap 132 (e.g., the orientation of the key cap 132 may be extrapolated based on the distance between the sense layer 154 and the drive layer 158 at both the positions A and B, for example, as detected based on the change in capacitance).

The keyboard assembly 108 may thus be used to control multiple separate functions of a computing device based on the orientation of the key cap 132. For example, depressing a first side of the key cap 132 may control a first operation of a computing device. Similarly, depressing a second side of the key cap 132 may control a second operation of the computing device. This may enable the key cap 132, in some implementations, to control motion in the same manner as a joystick, mouse track pad, or the like. Additionally or alternatively, the position-sensing capacitive sensing of the sense layer 154 and the drive layer 158 may be used in conjunction with the contact sensor 150 to control multiple functions of a computing device based on the orientation of the key cap 132 and/or the contact of the underside of the domed structure 124 with the contact sensor 150.

Figure 7:
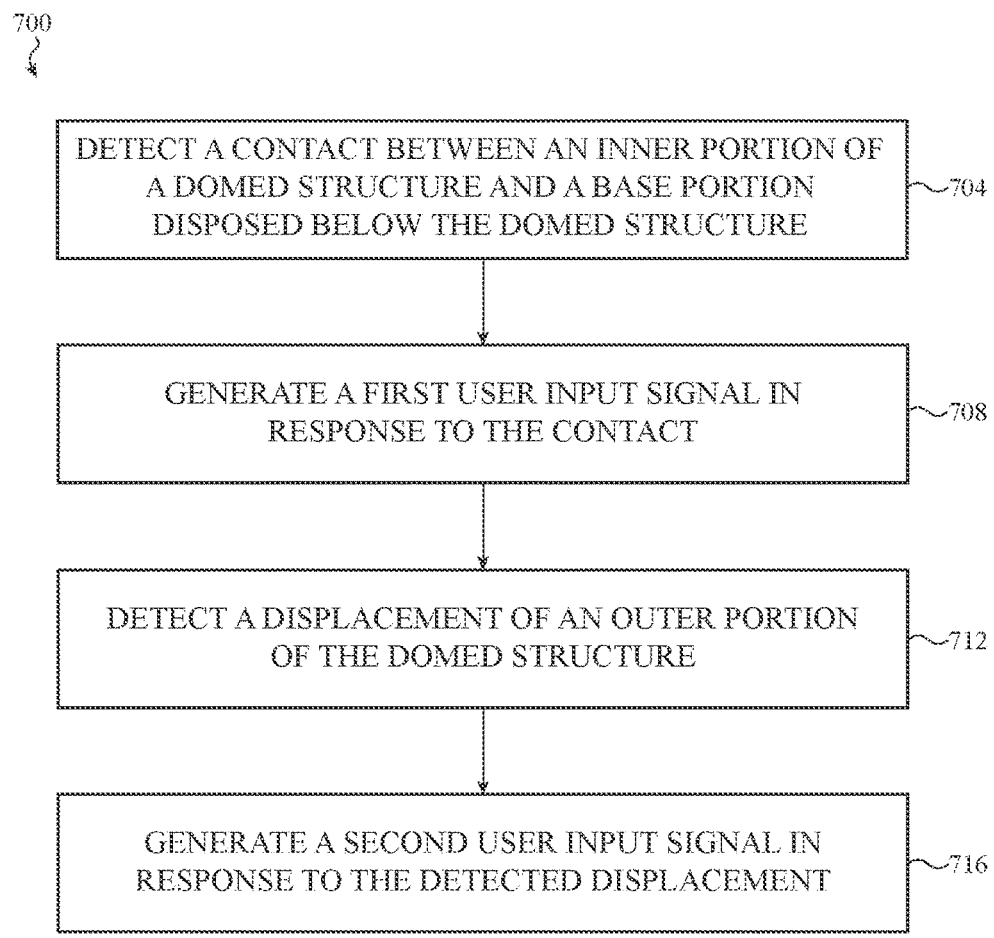
FIG. 7 is a flow diagram of a method for operating a dome switch.

To facilitate the reader's understanding of the various functionalities of the embodiments discussed herein, reference is now made to the flow diagram in FIG. 7, which illustrates process 700. While specific steps (and orders of steps) of the methods presented herein have been illustrated and will be discussed, other methods (including more, fewer, or different steps than those illustrated) consistent with the teachings presented herein are also envisioned and encompassed with the present disclosure.

In this regard, with reference to FIG. 7, process 700 relates generally to operating a dome switch. The process 700 may be used in conjunction with the electronic device described herein (e.g., electronic device 104 described in relation to FIG. 1A). In particular, a processing unit of the electronic device may be configured to perform one or more of the example operations described below.

At operation 704, a sensing element or sensing structure connected operatively to a domed or deformable structure may detect a contact between an inner portion of the domed or deformable structure and a base or base portion disposed below the domed structure. For example with reference to FIG. 6A, the contact sensor 150 may detect a contact between an underside of the domed structure 124 and the contact sensor 150. The contact sensor 150 may be disposed on the substrate 136, which is positioned below the domed structure 124.

At operation 708, the sensing element or sensing structure may generate a first user input signal in response to the contact between the inner portion of the domed structure and the base or base portion of the domed structure. For example, and with reference to FIG. 6A, the contact sensor 150 may generate an electrical response in response to the detecting of the contact between the underside of the domed structure 124 and the contact sensor 150. The electrical response generated from the contact sensor 150 may be used to control a function of the computing device, such as the electronic device 104 depicted in FIG. 1A. In some cases, the electronic device 104 may use the first user input signal to generate a first haptic effect corresponding to the detected contact. For example, the electronic device 104 may be configured to generate audio or tactile feedback to a user in response to the detected contact.

At operation 712, the sensing element or sensing structure may detect a displacement of an outer portion of the domed structure. For example, and with reference to FIGS. 2A-2C, the sensing element 228 may detect a displacement of the top portion 212 of the domed structure 204. For example, the sensing element 228 may detect a change in a capacitance measured between the sensing element 228 and another electrode disposed on or near the domed structure 204. The change in capacitance may be correlated with a translation of the upper portion 212.

At operation 716, the sensing element or sensing structure may generate a second user input signal in response to the detected displacement of the outer portion of the domed or deformable structure. For example, and with reference to FIGS. 2A-2C, the sensing element 228 may generate an electrical response in response to the detecting of the change in capacitance. The electrical response generated from the sensing element 228 may be used to control another function of a computing device. In this manner, the dome switch may be used to control multiple functions of a computing device. In some cases, the electronic device 104 may use the second user input signal to generate a second haptic effect corresponding to the detected displacement. For example, the electronic device 104 may be configured to generate audio or tactile feedback to a user in response to the detected contact.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

The foregoing description, for purposes of explanation, uses specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A dome switch, comprising:
   a base;
   a dome disposed over the base and having a substantially circular perimeter;
   a collar surrounding the dome and connected along the substantially circular perimeter and having a raised portion extending from the base;
   a key cap positioned above the dome; and
   a sensing structure configured to detect a collapse of the dome caused by a depression of the key cap, wherein
   the raised portion limits a downward motion of the key cap when the dome is collapsed.

2. The dome switch of claim 1, wherein the sensing structure comprises:
   a first sensing element disposed on the base and configured to detect contact of an interior surface of the upper portion of the dome with the base; and
   a second sensing element disposed on the collar and configured to detect at least one of:
      motion of the dome; or
      contact between the raised portion and the key cap.

3. The dome switch of claim 2, wherein:
   the first sensing element is configured to generate a first output in response to detecting the contact of the interior surface with the base; and
   the second sensing element is configured to generate a second output in response to at least one of:
      detecting the motion of the dome; and
      detecting the contact between the raised portion and the key cap.

4. The dome switch of claim 1, wherein the raised portion of the collar is configured to impede deformation of the dome after the upper portion contacts the base.

5. The dome switch of claim 1, wherein the collar is configured such that a force-displacement curve characteristic of the dome has at least two peaks.

6. The dome switch of claim 1, wherein:
   the dome and the collar define a gap therebetween; and
   the gap is configured to shrink as the dome deforms.

7. A method of operating a dome switch, comprising:
   receiving a first displacement at a key cap positioned above a dome, thereby buckling the dome;
   detecting a contact between an inner portion of the dome and a base portion disposed below the dome caused by the first displacement of the key cap;
   generating a first user input signal in response to detecting the contact;
   receiving a second displacement at the key cap that is greater than the first displacement;
   detecting the second displacement of the key cap;
   resisting the second displacement using a raised portion of a collar that is connected to a substantially circular perimeter of the dome; and
   generating a second user input signal in response to detecting the second displacement.

8. The method of claim 7, wherein detecting the second displacement occurs while the contact between the inner portion and the base portion is maintained.

9. The method of claim 7, wherein
   the dome buckles so that the contact between the inner portion and the base portion occurs.

10. The method of claim 7, further comprising:
    identifying an orientation of at least one of the first displacement or the second displacement of the key cap relative to the collar.

11. The method of claim 7, further comprising:
    in response to detecting the second displacement, generating a first haptic effect; and
    in response to the contact, generating a second haptic effect.

12. A dome switch, comprising:
    a base;
    a key cap positioned above the base;
    a dome having:
       an upper portion positioned below the key cap; and
       a lower portion positioned on the base and defining a substantially circular perimeter;
    a collar positioned about the substantially circular perimeter and having a raised portion that extends toward an underside of the key cap; and
    a sensing element disposed on the base and configured to detect contact of the upper portion with the base, wherein
    the raised portion limits a downward motion of the key cap.

13. The dome switch of claim 12, wherein:
    the dome comprises a dome wall extending between the upper and lower portions;
    the dome is configured to buckle in response to a buckling force; and
    a portion of the dome wall contacts the raised portion when the dome buckles, thereby causing the collar to resist deformation of the dome in response to an input force exceeding the buckling force.

14. The dome switch of claim 13, wherein:
    the sensing element is a first sensing element; and
    the dome switch further comprises:
       a second sensing element positioned on the collar and configured to produce an electrical response in response to deformation of the dome.

15. The dome switch of claim 14, wherein the second sensing element comprises an array of capacitive-sensing elements disposed on a top surface of the collar.

16. The dome switch of claim 15, wherein:
    a portion of the key cap relative to each element of the array of capacitive-sensing elements defines an orientation of the key cap; and
    the array of capacitive-sensing elements is configured to generate an output based on the orientation.

17. The dome switch of claim 13, wherein the collar relieves stress within the dome when the input force exceeds the buckling force.

18. The dome switch of claim 13, wherein the dome wall and the collar cooperate to control the input force required to deform the upper portion.

19. The dome switch of claim 13, wherein the raised portion has a thickness greater than a thickness of the dome wall.

20. The dome switch of claim 13, wherein a thickness of the lower portion is greater than a thickness of the upper portion.

21. The dome switch of claim 12, wherein the collar defines a chamfer opposite the dome.

22. The dome switch of claim 21, wherein the chamfer includes a sensing structure configured to detect at least one of a first deformation or a second deformation of the dome.

23. The dome switch of claim 12, wherein:
    the dome comprises a first material having a first stiffness; and
    the collar comprises a second material having a second stiffness that differs from the first stiffness.

24. The dome switch of claim 12, wherein the collar is molded to the dome about the substantially circular perimeter.

\* \* \* \* \*